(12) United States Patent
Yamashita

(10) Patent No.: US 7,724,350 B2
(45) Date of Patent: May 25, 2010

(54) IMMERSION EXPOSURE APPARATUS AND DEVICE MANUFACTURING METHOD

(75) Inventor: Keiji Yamashita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/031,575

(22) Filed: Feb. 14, 2008

(65) Prior Publication Data

US 2008/0304026 A1    Dec. 11, 2008

(30) Foreign Application Priority Data

Mar. 2, 2007    (JP) ............................. 2007-053052

(51) Int. Cl.
*G03B 27/42*    (2006.01)
*G03B 27/52*    (2006.01)

(52) U.S. Cl. .......................................... 355/53; 355/30
(58) Field of Classification Search ................. 355/30, 355/53, 67, 72; 250/548

See application file for complete search history.

(56) References Cited

U.S. PATENT DOCUMENTS

| | | | |
|---|---|---|---|
| 6,954,256 B2* | 10/2005 | Flagello et al. ............... | 355/53 |
| 7,317,507 B2* | 1/2008 | Straaijer ....................... | 355/53 |
| 7,388,649 B2* | 6/2008 | Kobayashi et al. ............. | 355/53 |
| 2005/0018155 A1 | 1/2005 | Cox | |
| 2005/0275817 A1 | 12/2005 | Nakata | |
| 2006/0164616 A1* | 7/2006 | Okada .......................... | 355/53 |
| 2006/0209281 A1* | 9/2006 | Hayashi ....................... | 355/53 |
| 2006/0250591 A1 | 11/2006 | Straaijer | |
| 2007/0058263 A1 | 3/2007 | Chang | |
| 2008/0117392 A1* | 5/2008 | Mulkens et al. ............... | 355/30 |
| 2008/0316452 A1* | 12/2008 | Dodoc et al. .................. | 355/53 |

FOREIGN PATENT DOCUMENTS

| | | |
|---|---|---|
| JP | 2006-004964 A | 1/2006 |
| JP | 2006-173295 A | 6/2006 |
| JP | 2007-053193 A | 3/2007 |

* cited by examiner

*Primary Examiner*—Hung Henry Nguyen
(74) *Attorney, Agent, or Firm*—Canon U.S.A., Inc. I. P. Division

(57) ABSTRACT

An immersion exposure apparatus includes a projection optical system, a first supply unit, and a second supply unit. The projection optical system projects exposure light from an original onto a substrate. The first supply unit forms a first liquid film in a space formed between the projection optical system and the substrate by supplying first liquid. The space includes a light path of the exposure light. The second supply unit forms a second liquid film around the first liquid film by supplying second liquid that is different from the first liquid.

2 Claims, 6 Drawing Sheets

IMMERSION EXPOSURE APPARATUS AND DEVICE MANUFACTURING METHOD

BACKGROUND OF THE INVENTION

1. Field of the Invention

The present invention relates to an immersion exposure apparatus that exposes a substrate to light passing through liquid and a device manufacturing method using the immersion exposure apparatus.

2. Description of the Related Art

To manufacture micro-semiconductor devices, such as semiconductor memories and logic circuits, using a photolithographic technique, reduction projection exposure apparatuses have been used. Reduction projection exposure apparatuses project a circuit pattern formed on an original, such as a reticle, onto a substrate, such as a wafer, using a projection optical system so that the circuit pattern is transferred onto the substrate.

The minimum critical dimension (the resolution) that can be transferred by a reduction projection exposure apparatus is proportional to a wavelength of light used for exposure and is inversely proportional to the numerical aperture (NA) of the projection optical system. Therefore, as the wavelength decreases and as the NA increases, the resolution becomes higher. Accordingly, in recent years, in response to a demand for reduction in the size of a semiconductor device, the wavelength of exposure light has been decreased. Thus, to decrease the wavelength of ultraviolet light used for exposure, rather than using a KrF excimer laser (wavelength=about 248 nm), an ArF excimer laser (wavelength=about 193 nm) is used.

In such a trend, immersion exposure has garnered much attention, since immersion exposure can further increase the resolution when a light source such as an ArF excimer laser is used. The immersion exposure decreases the effective wavelength of the exposure light by filling liquid in a space between the final surface of the projection optical system and a wafer (i.e., liquid is used for a medium disposed between the projection optical system and the wafer). Thus, the NA of the projection optical system can be increased in practice, and the resolution can be increased. The NA of the projection optical system is expressed as: NA=n×sin θ where n is an index of refraction of a medium. By filling a medium having an index of refraction higher than that of air (n>1), the NA can be increased to n.

In addition, liquid having a higher index of refraction provides a higher resolution. Accordingly, in place of immersion exposure apparatuses using pure water (purified water), an immersion exposure apparatus using liquid having a high index of refraction has been developed (refer to, for example, Japanese Patent Laid-Open No. 2006-004964).

In some immersion exposure apparatuses using liquid having a high index of refraction, in order to decrease a variation in transmittance of the liquid having a high index of refraction, a technique for purging an area around a liquid film by inactive gas has been developed (refer to, for example, Japanese Patent Laid-Open No. 2006-173295).

A first problem concerning the immersion exposure apparatuses using liquid having a high index of refraction is that the liquid having a high index of refraction tends to absorb oxygen easily as compared with pure water. Accordingly, when the liquid having a high index of refraction is exposed to air, the transmittance of the liquid for light in an ultraviolet light range is significantly decreased. The decrease in the transmittance of the liquid increases the temperature of the liquid due to absorption of exposure light. Accordingly, the index of refraction of the liquid varies. The variation in the index of refraction deteriorates the exposure performance (the image formation performance). To maintain high exposure performance, the transmittance of the liquid needs to be precisely controlled. In addition, to maintain high exposure performance, it is desirable that the transmittance of the liquid maintains a constant value. When the transmittance of the liquid varies, aberration of the projection optical system needs to be controlled in accordance with the variation.

To prevent oxygen from entering the liquid having a high index of refraction, Japanese Patent Laid-Open No. 2006-173295 describes the technique for purging an area around a liquid film by inactive gas. However, in such a case, the structure of a chamber is complicated.

A second problem concerning the immersion exposure apparatuses using liquid having a high index of refraction is that, since the liquid having a high index of refraction has a surface tension smaller than that of pure water, it is difficult to increase contact angles with respect to the surface of a wafer and the surface of a top plate of a wafer stage. Accordingly, in a local fill method, when exposure is performed while the wafer is moved together with the top plate, part of the liquid easily remains on the wafer or the top plate. If part of the liquid remains on the wafer or the top plate, the liquid may evaporate, and therefore, fluctuations in the conditions of an exposure environment, such as changes in temperature, may occur. In addition, when the liquid returns to a liquid film, air bubbles and turbulence may disadvantageously occur in the liquid film.

SUMMARY OF THE INVENTION

Accordingly, the present invention provides an immersion exposure apparatus that reduces absorption of oxygen in a liquid film formed between a projection optical system and a wafer or that reduces an amount of liquid remaining on a wafer or a top plate of a wafer stage.

According to an embodiment of the present invention, an immersion exposure apparatus includes a projection optical system configured to project exposure light from an original onto a substrate, a first supply unit configured to form a first liquid film in a space formed between the projection optical system and the substrate by supplying first liquid, where the space includes a light path of the exposure light, and a second supply unit configured to form a second liquid film around the first liquid film by supplying second liquid that is different from the first liquid.

According to the present invention, an immersion exposure apparatus can reduce an amount of oxygen entering a liquid film formed between a projection optical system and a substrate or can reduce an amount of liquid remaining on a substrate or a top panel of a substrate stage.

Further features and aspects of the present invention will become apparent from the following description of exemplary embodiments with reference to the attached drawings.

DESCRIPTION OF THE EMBODIMENTS

Figure 1:
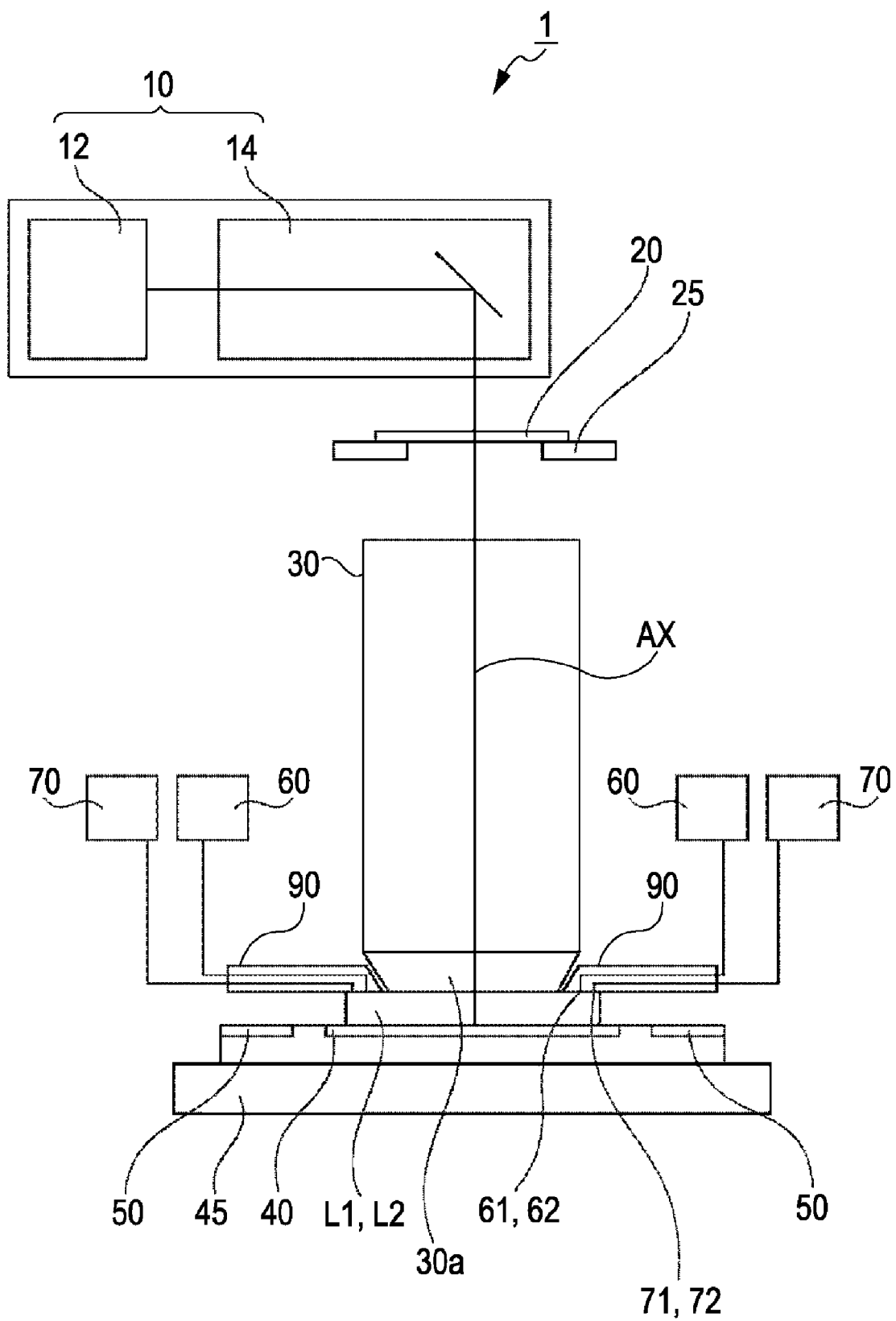
FIG. 1 is a cross-sectional view of an example exposure apparatus according to an embodiment of the present invention.

An exposure apparatus according to an embodiment of the present invention is described below with reference to the accompanying drawings. In the drawings, similar numbering will be used for similar members, and the description is not repeated.

FIG. 1 is a cross-sectional view of an exposure apparatus 1 according to an embodiment of the present invention.

The exposure apparatus 1 supplies liquid L1 and liquid L2 to a space between a surface (the final surface) of the final optical element 30a of a projection optical system 30 facing a wafer stage 45 and the wafer 40. In addition, the exposure apparatus 1 supplies the liquid L1 and the liquid L2 to the vicinity of the space. The final optical element 30a has a light axis AX. The exposure apparatus 1 is an immersion exposure apparatus that exposes the wafer 40 to light passing through a circuit pattern formed on a reticle 20, a projection optical system, and the liquid L1.

The exposure apparatus 1 exposes the wafer 40 to light using a step-and-scan exposure method or a step-and-repeat exposure method. The present embodiment is described with reference to an exposure apparatus using a step-and-scan exposure method.

The exposure apparatus 1 includes an illumination unit 10, a reticle stage 25 having the reticle 20 mounted thereon, the projection optical system 30, a wafer stage (a substrate stage) 45 having the wafer 40 mounted thereon, a liquid supporting plate (a top plate) 50, and a liquid supply and recovery mechanism 60. The exposure apparatus 1 further includes a distance measuring unit and a control unit (neither are shown). The distance measuring unit measures two-dimensional positions of the reticle stage 25 and the wafer stage 45 in real time using a reference mirror and a laser interferometer. The control unit includes a central processing unit (CPU) and a memory. The control unit controls the operation performed by the exposure apparatus 1 and, in particular, controls driving of the reticle stage 25 and the wafer stage 45.

The illumination unit 10 illuminates the reticle 20 having a transfer circuit pattern formed thereon. The illumination unit 10 includes a light source unit 12 and an illumination optical system 14.

The light source unit 12 can employ, for example, an ArF excimer laser with a wavelength of about 193 nm or a KrF excimer laser with a wavelength of about 248 nm as a light source. However, the light source is not limited to an excimer laser. For example, an $F_2$ laser with a wavelength of about 157 nm may be used. In addition, any number of light sources can be used in the light source unit 12.

The illumination optical system 14 allows exposure light emitted from the light source unit 12 to illuminate the reticle 20.

The reticle 20 is an original. For example, the reticle 20 is made from quartz. A pattern to be transferred is formed on the reticle 20. The reticle 20 is supported by the reticle stage 25 and is driven by the reticle stage 25. Exposure light passing through the reticle 20 is projected onto the wafer 40 by the projection optical system 30. The reticle 20 is disposed at a position that is optically conjugate with the wafer 40. Since the exposure apparatus 1 employs a step-and-scan method, the exposure apparatus 1 transfers the pattern formed on the reticle 20 onto the wafer 40 by scanning the reticle 20 and the wafer 40.

The reticle stage 25 supports the reticle 20 and is moved by a moving mechanism (not shown). The reticle 20 and the projection optical system 30 are disposed on, for example, a lens barrel surface plate, which is supported by a base frame via a damper. The base frame is installed on, for example, a floor. The reticle stage 25 may be any of existing ones. The moving mechanism includes, for example, a linear motor. The moving mechanism can move the reticle 20 by moving the reticle stage 25 in the X and Y directions.

The projection optical system 30 forms an image of the pattern of the reticle 20 on the wafer 40. The projection optical system 30 may be a catadioptric optical system or a refracting optical system.

According to the present embodiment, the projection optical system 30 includes a plane-convex lens, which is the final optical element 30a disposed on a side adjacent to the wafer 40. Since the final surface of the projection optical system 30 is a plane surface of the plane-convex lens, the projection optical system 30 can prevent disturbance flow of liquid L during a scan operation, and therefore, prevent air bubbles caused by the disturbance flow from forming in the liquid L. Single-crystalline barium lithium fluoride (BaLiF3) or Lutetium Aluminum Garnet (LuAG) having a high index of refraction can be used for the material of the plane-convex lens. A protective film may be formed on the plane surface of the plane-convex lens in order to protect the plane surface from the liquid L. According to the present invention, the final optical element 30a of the projection optical system 30 is not limited to the plane-convex lens 32. For example, a meniscus lens may be employed for the final optical element 30a.

According to the present embodiment, the wafer 40 is used for a substrate to be exposed. However, a glass plate or a liquid crystal plate may be used in place of a wafer. The wafer 40 has a photoresist coated thereon.

The wafer stage 45 supports the wafer 40 via a wafer chuck (not shown). The wafer stage 45 is moved by a moving mechanism (not shown). Any existing mechanism can be applied to the wafer stage 45. It is desirable that the wafer stage 45 has six degrees of freedom (e.g., movement parallel to each of the X-axis, Y-axis, and Z-axis and rotational movement about each of the X-axis, Y-axis, and Z-axis). For example, the wafer stage 45 moves the wafer 40 in the X, Y, and Z directions using a linear motor. For example, the reticle 20 and the wafer 40 are simultaneously scanned. The positions of the reticle stage 25 and the wafer stage 45 are monitored by, for example, a laser interferometer. The reticle stage 25 and the wafer stage 45 are driven while maintaining a constant speed ratio. For example, the wafer stage 45 is disposed on a stage surface plate, which is installed on, for example, a floor via a damper.

As illustrated in FIG. 1, the liquid supporting plate 50 of the wafer stage 45 is disposed so as to surround the wafer 40 supported by the wafer stage 45. To start exposure from an end of the wafer 40, a space beneath the final surface of the projection optical system 30 needs to be filled with liquid before the end of the wafer 40 reaches an exposure area (an area that is irradiated with the exposure light). Therefore, a liquid film is formed even outside the wafer 40 by disposing the liquid supporting plate 50 having a surface at substantially the same height as that of the surface of the wafer 40 outside the wafer 40.

The liquid supply and recovery mechanism 60 for the liquid L1 includes a first supply unit and a first recovery unit.

The liquid supply and recovery mechanism 60 supplies, via a supply nozzle (a first supply port) 61, the liquid L1 to a space formed between the final optical element 30a of the projection optical system 30 and the wafer 40. Thus, a light path of the exposure light is filled with the liquid L1. In addition, the liquid supply and recovery mechanism 60 for the liquid L1 recovers the liquid L1 supplied to the space formed between the final optical element of the projection optical system 30 and the wafer 40 via a recovery nozzle (a first recovery port) 62.

A liquid supply and recovery mechanism 70 for the liquid L2 includes a second supply unit and a second recovery unit. The liquid supply and recovery mechanism 70 supplies the liquid L2 via a supply nozzle (a second supply port) 71 so that the liquid L2 surrounds the liquid film of the liquid L1. Thus, a liquid film of the liquid L2 is formed around the liquid film of the liquid L1. In addition, the liquid supply and recovery mechanism 70 for the liquid L2 recovers the liquid L2 supplied to outside the liquid film of the liquid L1 via a recovery nozzle (a second recovery port) 72. The supply nozzle 61, the recovery nozzle 62, the supply nozzle 71, and the recovery nozzle 72 are disposed in a nozzle unit 90. The nozzle unit 90 is disposed so as to surround the final optical element 30a of the projection optical system 30.

The liquid supply and recovery mechanism 60 for the liquid L1 and the liquid supply and recovery mechanism 70 for the liquid L2 employ a local fill method, in which only part of the surface of the wafer 40 is immersed in liquid. The periphery of the liquid L2 may be sealed with an air curtain (not shown).

The liquid L1 is liquid (a material) that has a high transmittance for the wavelength of the exposure light and that prevents dust and dirt from being deposited on the projection optical system 30 and is suitable for use in a resist process. For example, the liquid L1 is saturated hydrocarbon based liquid having a high index of refraction. The liquid L1 can be selected in accordance with the type of photoresist coated on the wafer 40 and the wavelength of the exposure light. In order to protect the final optical element 30a of the projection optical system 30 from the affect of the liquid L1, a protective film may be coated on the final optical element 30a.

The index of refraction of the liquid L1 for the exposure light is higher than that of the liquid L2. It is desirable that the index of refraction of the liquid L1 for the exposure light is higher than 1.5.

The liquid L2 is liquid (a material) that is immiscible with the liquid L1. Examples of the material of the liquid L2 that is immiscible with the liquid L1 include ultra pure water, pure water, and ionized water. The contact angles between the liquid L2 and the surface of the wafer 40 and between the liquid L2 and the surface of the liquid supporting plate 50 are larger than those between the liquid L1 and the surface of the wafer 40 and between the liquid L1 and the surface of the liquid supporting plate 50, respectively.

The liquid supply and recovery mechanism 60 for the liquid L1 includes a purifying mechanism (not shown) for increasing the degree of purity of the recovered liquid L1 and a degassing mechanism (not shown) for expelling dissolved oxygen from the liquid L1. The liquid supply and recovery mechanism 60 for the liquid L1 further includes a pump for pumping the liquid L1, a flow rate control unit for controlling a flow volume of the liquid L1, a temperature control unit for controlling the temperature of the liquid L1, and a mixing mechanism for mixing new liquid with the liquid purified after recovery.

The liquid supply and recovery mechanism 70 for the liquid L2 includes a pump for pumping the liquid L2, a flow rate control unit for controlling a flow volume of the liquid L2, and a temperature control unit for controlling the temperature of the liquid L2. When the liquid L2 is similar to the liquid L1, the liquid supply and recovery mechanism 70 may further include a degassing mechanism for expelling dissolved oxygen from the liquid L2.

Exemplary embodiments of the present invention are described in detail below.

First Exemplary Embodiment

According to a first exemplary embodiment, an exposure apparatus includes an ArF excimer laser for a light source unit and employs a step-and-scan exposure method.

Figure 2:
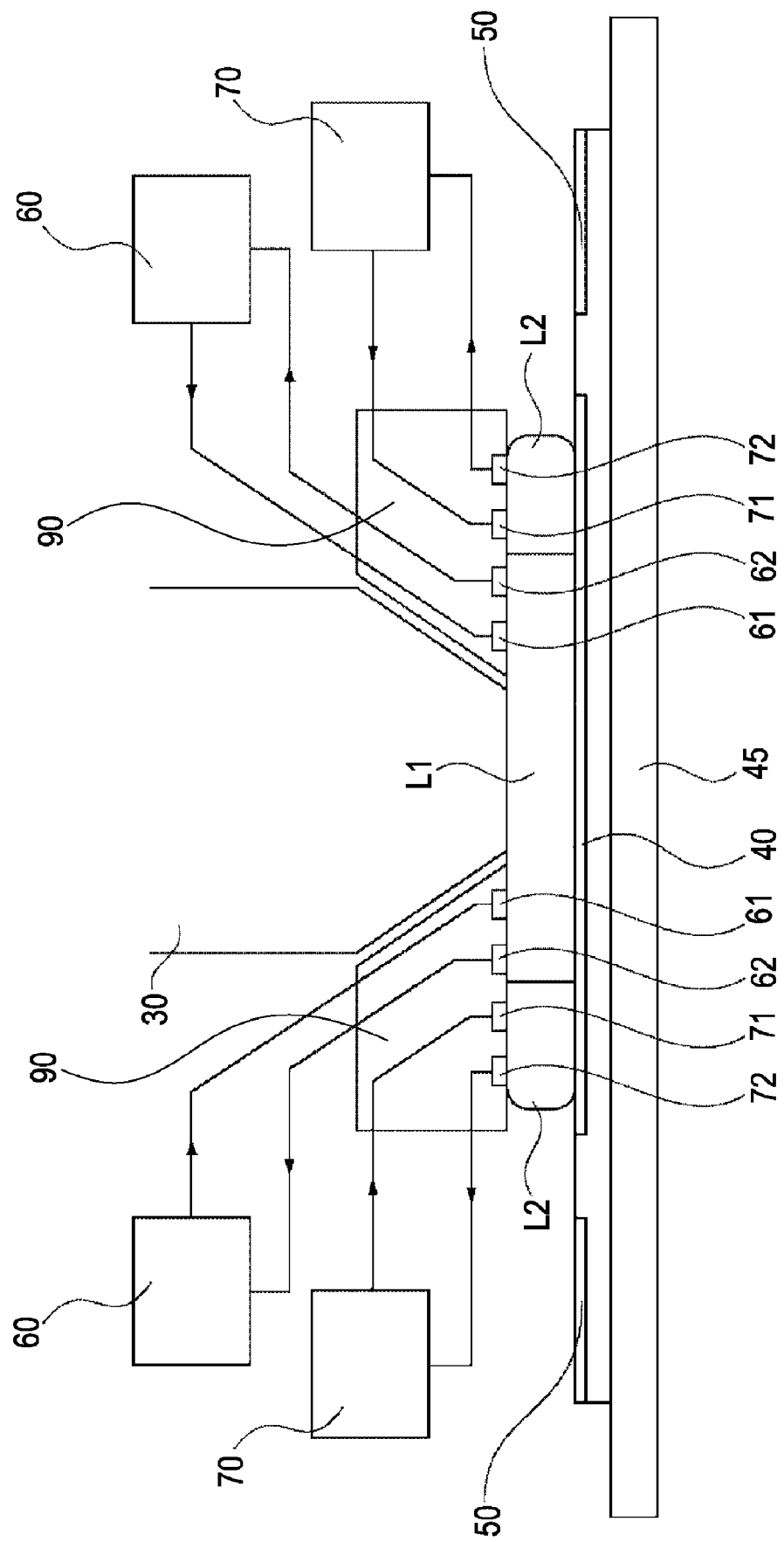
FIG. 2 is an enlarged view of a main portion of the exposure apparatus according to a first embodiment.

FIG. 2 is an enlarged view of a main portion of the exposure apparatus according to the first embodiment. As illustrated in FIG. 2, the exposure apparatus includes the liquid supply and recovery mechanism 60 for the liquid L1 and the liquid supply and recovery mechanism 70 for the liquid L2. That is, the exposure apparatus includes a supply and recovery mechanism for each of the liquid L1 and the liquid L2. The liquid L1 is supplied to a space formed by the final surface of the projection optical system 30 and the wafer 40. Saturated hydrocarbon based liquid having a high index of refraction of 1.64 is used for the liquid L1. Ultra pure water is used for the liquid L2 that is immiscible with the liquid L1.

In the exposure apparatus according to the first exemplary embodiment, the wafer 40 is exposed to light with a pattern of the reticle 20. The exposure light has a light path filled with liquid between the projection optical system 30 and the wafer 40. Accordingly, a liquid film of the liquid L1 and a liquid film of the liquid L2 are formed during exposure of the wafer 40.

A liquid repellent property (water repellent property) fluorine-based material can be coated on the liquid supporting plate 50. Alternatively, a liquid repellent property fluorine-based material can be used for the liquid supporting plate 50.

Figure 3:
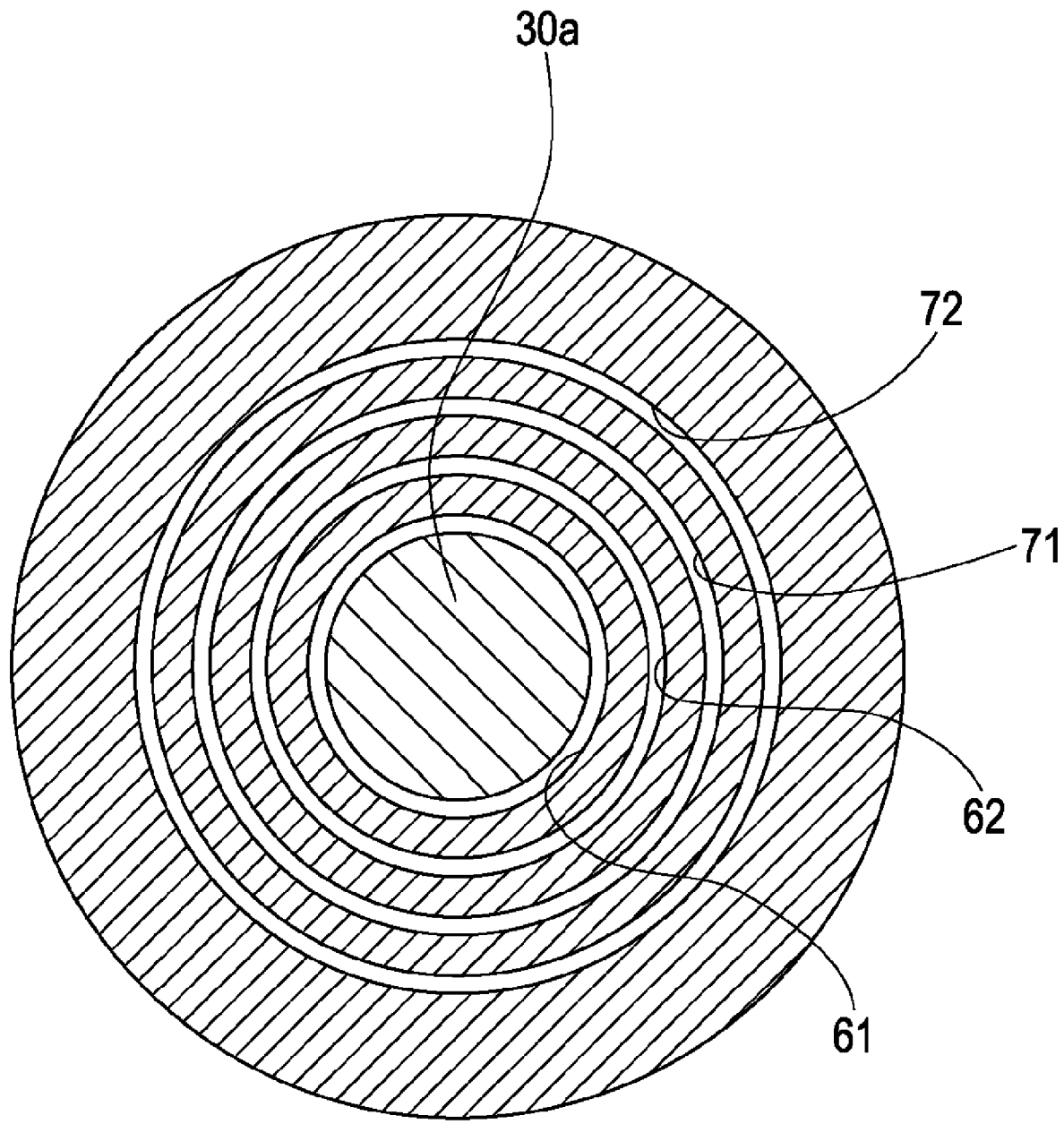
FIG. 3 is a cross-sectional view of the main portion of the exposure apparatus including four nozzles illustrated in FIG. 2.

FIG. 3 is a cross-sectional view of the exposure apparatus illustrated in FIG. 2 cut by a plane perpendicular to a light axis AX and including the supply nozzle 61, the recovery nozzle 62, the supply nozzle 71, and the recovery nozzle 72. As illustrated in FIGS. 2 and 3, the liquid supply and recovery mechanism 60 for the liquid L1 supplies the liquid L1 to a space formed between the final surface of the projection optical system 30 and the wafer 40 using the supply nozzle 61. Thus, a liquid film of the liquid L1 is formed. In addition, the liquid supply and recovery mechanism 60 recovers the liquid L1 using the recovery nozzle 62 and circulates the liquid L1 through a purifying mechanism and a degassing mechanism (neither are shown).

The nozzle unit 90 includes, outwardly from the final optical element 30a, four nozzles: the supply nozzle 61, the recovery nozzle 62, the supply nozzle 71, and the recovery nozzle 72.

After a liquid film of the liquid L1 is formed in the space between the final surface of the projection optical system 30 and the wafer 40, the liquid supply and recovery mechanism 70 for the liquid L2 supplies, using the supply nozzle 71, the liquid L2 to outside the liquid L1 supplied by the liquid supply and recovery mechanism 60 for the liquid L1. In addition, the liquid supply and recovery mechanism 70 recovers the liquid L2 using the recovery nozzle 72 disposed outside the supply nozzle 61 for the liquid L2. Thereafter, the liquid supply and recovery mechanism 70 circulates the liquid L2.

Since the surface tension of the liquid L1 is small, a large contact angle cannot be obtained even when a fluorine-based material is coated on the surface of the liquid supporting plate 50. Therefore, if only the liquid L1 is used, part of the liquid L1 remains on the liquid supporting plate 50 when exposure is performed while the wafer 40 is moved together with the liquid supporting plate 50 or when the wafer 40 is moved by a long distance. However, since the liquid L2 disposed outside the liquid L1 is ultra pure water, the fluorine-based material coated on the surface of the liquid supporting plate 50 exhibits liquid repellency property for the liquid L2 (i.e., the liquid L2 has a contact angle that is larger than that of the liquid L1 with respect to the surface of the liquid supporting plate 50). In addition, since the liquid L1 is immiscible with the liquid L2, the liquid film of the liquid L2 pushes back the liquid L1 that tends to remain on the liquid supporting plate 50. Accordingly, an amount of the liquid L1 remaining on the liquid supporting plate 50 can be reduced. For the same reason, when the contact angle of the liquid L2 is larger than that of the liquid L1 with respect to a resist coated on the surface of the wafer 40, an amount of the liquid L1 remaining on the wafer 40 can be reduced.

Furthermore, the liquid film of the liquid L2 formed so as to surround the liquid film of the liquid L1 functions as a blocking layer against ambient air. Accordingly, entrance of oxygen into the liquid L1 can be reduced. As a result, a variation in the transmittance of the liquid L1 can be reduced.

Second Exemplary Embodiment

Like the first exemplary embodiment, according to a second exemplary embodiment, an exposure apparatus includes an ArF excimer laser for a light source unit and employs a step-and-scan exposure method.

Figure 4:
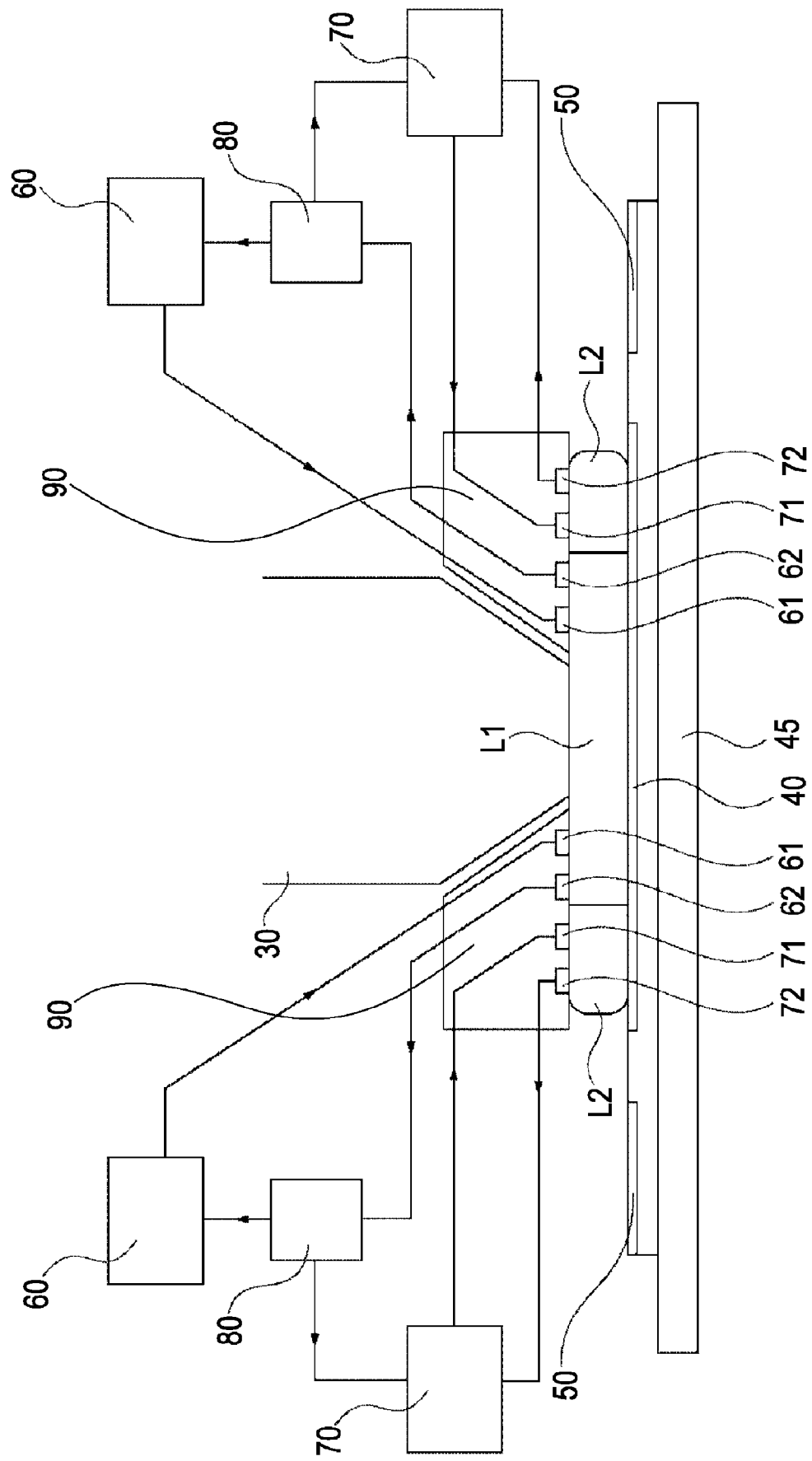
FIG. 4 is an enlarged view of a main portion of an example exposure apparatus according to a second embodiment of the present invention.

However, unlike the first exemplary embodiment, the exposure apparatus includes a separation mechanism 80. FIG. 4 is an enlarge view of a main portion of the exposure apparatus according to the second exemplary embodiment.

When exposure is performed while the wafer 40 is moved together with the liquid supporting plate 50 or when the wafer 40 is moved by a long distance, the liquid L2 may be recovered by the recovery nozzle 62 for the liquid L1 together with the liquid L1. Accordingly, the separation mechanism 80 is provided downstream of the recovery nozzle 62 in order to separate the liquid L1 from the liquid L2.

After the liquid L1 is separated from the liquid L2 by the separation mechanism 80, the liquid L1 is recovered into the liquid supply and recovery mechanism 60 for the liquid L1 and is circulated. In contrast, the liquid L2 is recovered into the liquid supply and recovery mechanism 70 for the liquid L2. Thereafter, the liquid L2 may be circulated or may be externally output as waste fluid.

The separation mechanism 80 separates the liquid L1 from the liquid L2 using one of the following methods. For example, the liquid L1 is separated from the liquid L2 in a tank using a gravitational force. Alternatively, the liquid L1 is separated from the liquid L2 using a centrifugal method or a thermal separation method. According to the present embodiment, even when the liquid L2 is recovered by the liquid supply and recovery mechanism 60 for the liquid L1, the liquid L2 can be separated from the liquid L1 and can be reused. Thus, the liquid L2 can be efficiently used.

Figure 5:
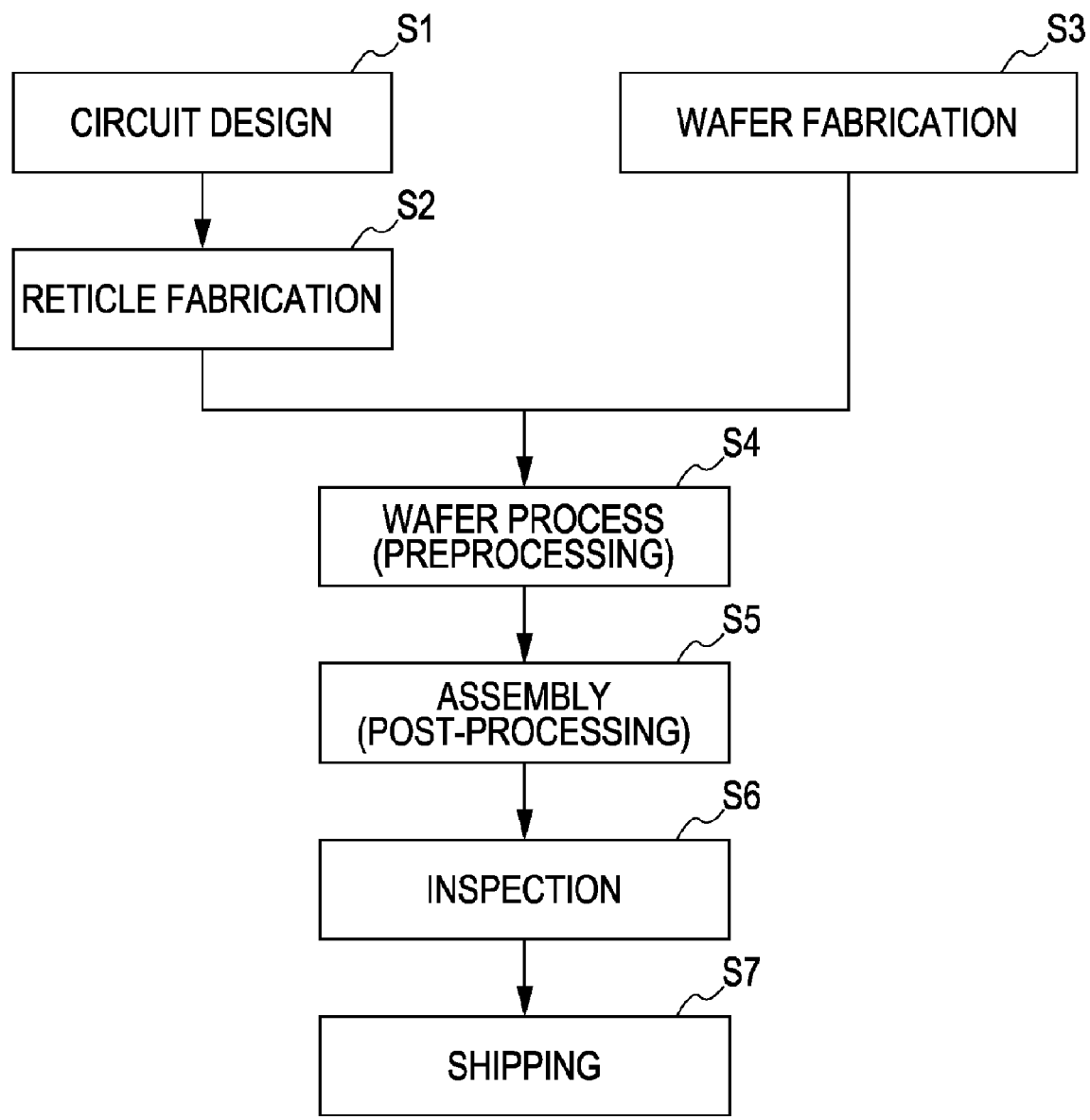
FIG. 5 is a flow chart illustrating a method for manufacturing a device.

According to an embodiment of the present invention, a device manufacturing method using the exposure apparatus 1 is provided. The device manufacturing method is described next with reference to FIGS. 5 and 6. FIG. 5 is a flow chart illustrating a method for manufacturing a device (a semiconductor device or a liquid crystal device). Here, a method for manufacturing a semiconductor device is described. In step S1 (a circuit design step), a circuit of a device is designed. In step S2 (a reticle fabrication step), a reticle having a designed circuit pattern is fabricated. In step S3 (a wafer fabrication step), a wafer is fabricated from a material, such as silicon. In step S4 (a wafer process), an actual circuit is formed on the wafer using the reticle by a photolithographic technique. This step is referred to as "preprocessing". In step S5 (assembly), the wafer produced in step S4 is fabricated into a semiconductor chip. This step is referred to as "post-processing". This step includes an assembly sub-step (dicing and bonding) and a packaging sub-step (chip sealing). In step S6 (inspection), a variety of tests, such as a validity test and a durability test, are performed on the semiconductor device produced in step S5. Through these steps, a semiconductor device is achieved and shipped (step S7).

Figure 6:
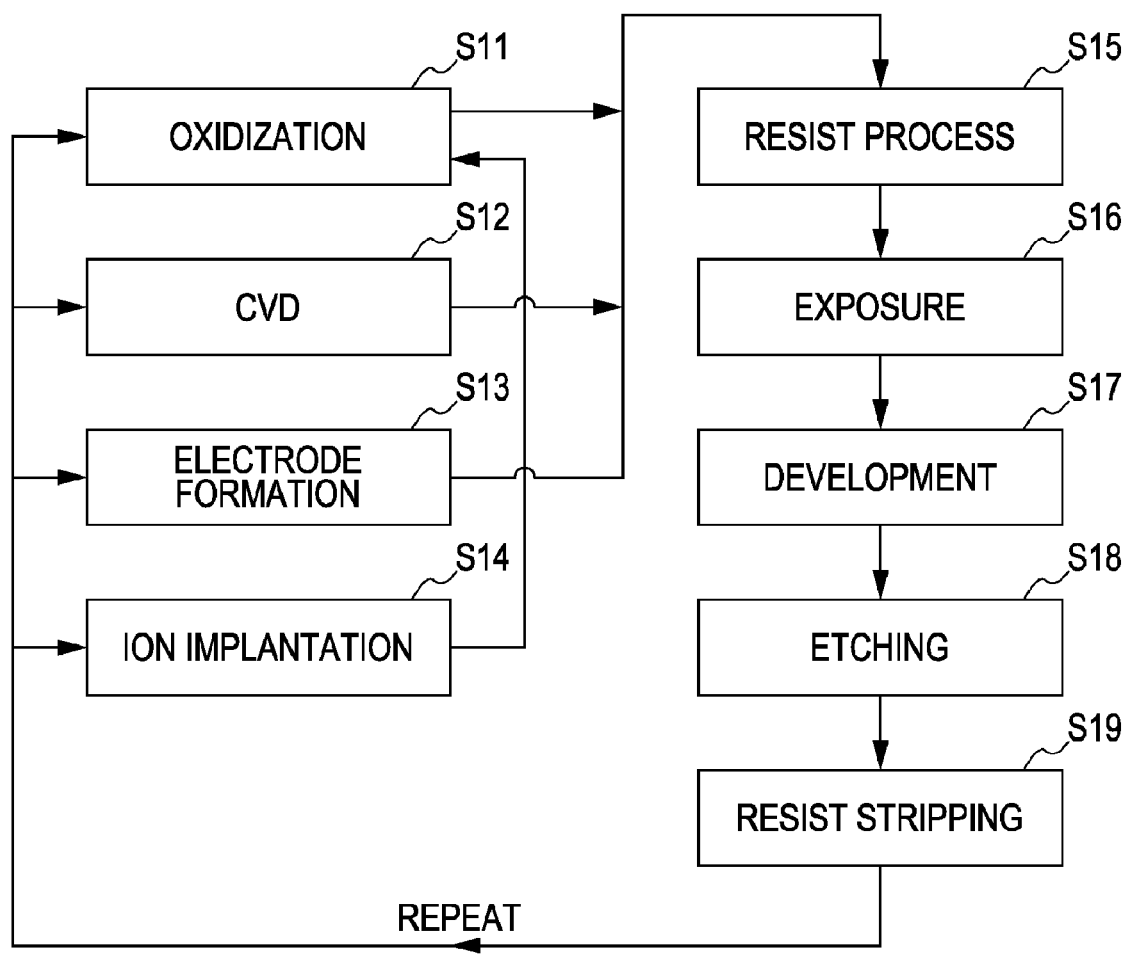
FIG. 6 is a detailed flow chart of a wafer process in step S4 shown in FIG. 5.

FIG. 6 is a detailed flowchart of the wafer process performed in step S4. In step S11 (oxidation), the surface of the wafer is oxidized. In step S12 (CVD), an insulating layer is formed on the surface of the wafer. In step S13 (electrode formation), electrodes are formed on the wafer by, for example, vapor disposition. In step S14 (ion implantation), ions are implanted into the wafer. In step S15 (a resist process), a photosensitive material is applied to the wafer. In step S16 (exposure), the wafer is exposed to light passing through the circuit pattern formed on the reticle using the exposure apparatus 1. In step 17 (development), the exposed wafer is developed. In step S18 (etching), portions other than a developed resist image are removed. In step S19 (resist stripping), an unused resist after etching is stripped. These steps are repeated so as to form a multi-layer circuit pattern on the wafer. This method for manufacturing a device according to the present embodiment can provide devices having a quality higher than that of existing devices. Thus, the method for manufacturing a device using the exposure apparatus 1 and the manufactured devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-053052 filed Mar. 2, 2007, which is hereby incorporated by reference herein in its entirety.

What is claimed is:

1. An immersion exposure apparatus comprising:
   a projection optical system configured to project exposure light from an original onto a substrate;
   a first supply unit configured to form a first liquid film in a space formed between the projection optical system and the substrate by supplying first liquid having a higher index of refraction than water via a first supply port, the space including a light path of the exposure light;
   a second supply unit configured to form water film outside the first liquid film by supplying water via a second supply port after forming the first liquid film;
   a first recovery unit configured to recover the first liquid supplied by the first supply unit via a first recovery port; and a second recovery unit configured to recover the water supplied by second supply unit and formed outside the first liquid via a second recovery port;

wherein the first supply port, the first recovery port, the second supply port and the second recovery port are arranged in the order of distance from the optical axis of the projection optical system from the shortest to the longest, and wherein the first recovery port also recovers the water supplied via the second supply port.

2. The immersion exposure apparatus according to claim 1, further comprising a separation mechanism for separating the first liquid from the water recovered via the first recovery via the first recovery port.

* * * * *